(12) United States Patent
Kobae et al.

(10) Patent No.: US 7,507,654 B2
(45) Date of Patent: Mar. 24, 2009

(54) METHOD FOR MOUNTING ELECTRONIC ELEMENT ON A CIRCUIT BOARD

(75) Inventors: Kenji Kobae, Kawasaki (JP); Hidehiko Kira, Kawasaki (JP); Norio Kainuma, Kawasaki (JP); Takayoshi Matsumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/521,482

(22) Filed: Sep. 15, 2006

(65) Prior Publication Data
US 2007/0015311 A1    Jan. 18, 2007

Related U.S. Application Data

(62) Division of application No. 11/041,292, filed on Jan. 25, 2005, now Pat. No. 7,355,285.

(30) Foreign Application Priority Data

Oct. 29, 2004    (JP)    ............... 2004-316499

(51) Int. Cl.
*H01L 21/44* (2006.01)
(52) U.S. Cl. ............... 438/613; 438/120; 257/737; 257/778; 257/E21.508; 257/E23.021
(58) Field of Classification Search ......... 438/108–113, 438/120–123, 612–613
See application file for complete search history.

(56) References Cited

U.S. PATENT DOCUMENTS

| 5,828,128 | A | 10/1998 | Higashiguchi et al. |
| 6,602,733 | B2 * | 8/2003 | Iwahashi et al. ............ 438/108 |
| 2004/0124007 | A1 | 7/2004 | Ashida |
| 2005/0009241 | A1 * | 1/2005 | Nakata et al. ............... 438/126 |

FOREIGN PATENT DOCUMENTS

| JP | 9-45810 | 2/1997 |
| JP | 2001-68594 | 3/2001 |
| JP | 2004-111543 | 4/2004 |
| JP | 2004-134649 | 4/2004 |

* cited by examiner

*Primary Examiner*—Dung A. Le
(74) *Attorney, Agent, or Firm*—Arent Fox LLP.

(57) ABSTRACT

Method for mounting an electronic component on a circuit board firstly flip-chip bonding positioning bumps of the electronic component to pads of the circuit board by applying ultrasonic vibrations to the electronic component. Bonding bumps, whose diameters are shorter than those of the positioning bumps and whose projecting lengths are shorter than those of the positioning bumps, of the electronic component are flip-chip bonded to electrodes of the circuit board by applying ultrasonic vibrations to the electronic element. In this manner, a center of each of the bonding bumps is previously relatively displaced, with respect to a center of each of the electrodes in a width direction, in a direction parallel to a direction to the ultrasonic vibrations.

5 Claims, 5 Drawing Sheets

METHOD FOR MOUNTING ELECTRONIC ELEMENT ON A CIRCUIT BOARD

This application is a divisional of U.S. patent application Ser. No. 11/041,292, filed Jan. 25, 2005, now U.S. Pat No. 7,355,285 which is based upon and claims the benefit of priority from the prior Japanese Patent Application No. 2004-316499 filed on Oct. 29, 2004. The entire contents of these applications are incorporated herein by reference.

BACKGROUND OF THE INVENTION

The present invention relates to a structure and a method of mounting an electronic component, more precisely relates to a structure and a method of mounting an electronic component, in which the electronic component is bonded by ultrasonic waves.

When a semiconductor chip, which is an example of the electronic component, is mounted on a circuit board by flip chip bonding, bumps of the semiconductor chip are headed for the circuit board, then the bumps, which are made of gold or solder, are respectively bonded to electrodes of the circuit board. A space between the semiconductor chip and the circuit board is filled with synthetic resin so as to protect a circuit face of the semiconductor chip, prevent the bumps from corrosion and improve bonding strength therebetween.

These days, the semiconductor chip is flip-chip-bonded by applying ultrasonic vibrations. By applying ultrasonic vibrations, bonding sections between the bumps and the electrodes are alloyed and bonded or bonded.

These days, semiconductor chips are miniaturized and have many pins. Therefore, separations between bums must be very short. When the small semiconductor chip having many pins is bonded to a circuit board by ultrasonic vibrations, the bumps of the semiconductor chip are easily displaced from electrodes of the circuit board, so that bonding reliability between the bums and the electrodes is lowered.

FIGS. 7A and 7B show a conventional structure of mounting a semiconductor chip on a circuit board. FIG. 7A is a plan view showing positional relationships between bumps 12a and 12b of the semiconductor chip 10 and electrodes 22a and 22b of the circuit board; FIG. 7B is a partial front view of bonding sections between the semiconductor chip 10 and the circuit board 20. The semiconductor chip 10 is flip-chip-bonded to the circuit board 20 by ultrasonic vibrations. Bumps 12 of the semiconductor chip 10 are displaced from electrodes 22 of the circuit board 20.

By applying ultrasonic vibrations to the semiconductor chip 10, the semiconductor chip 10 reciprocally moves in a direction of the ultrasonic vibrations, e.g., right and left in FIG. 7A. Each of the electrodes 22 is formed into a thin rectangular. Therefore, even if the bumps 12a are displaced from the rectangular electrodes 22a, whose longitudinal axis is parallel to the direction of the ultrasonic vibrations, and bonded to the electrodes 22a, the bonding sections occur no problems. On the other hand, if the bumps 12b are displaced from the rectangular electrodes 22b, whose transverse axis is parallel to the direction of the ultrasonic vibrations, the bumps 12b are bonded at positions displaced from centers of the electrodes 22b, so that bonding reliability between the bums 12b and the electrodes 22b must be lowered.

The inventors measured displacement of semiconductor chips with respect to circuit boards. The results are shown in FIG. 8. Three groups (1), (2) and (3) of samples were prepared. Semiconductor chips of the samples were flip-chip-bonded to the circuit boards. In each group (1), (2) and (3), three samples were flip-chip-bonded with loads of 5, 10 and 15 gf/bump respectively. No ultrasonic vibrations were applied to the samples of the group (1); ultrasonic vibrations of 200 kHz were applied to the group (2); and ultrasonic vibrations of 50 kHz were applied to the group (3). According to FIG. 8, in the case of applying no ultrasonic vibrations, displacement of the semiconductor chips were small without reference to variation of the loads. On the other hand, in the case of applying ultrasonic vibrations, the displacement was easily occurred, and the displacement was increased with increasing frequency of ultrasonic vibrations.

In each group (2) and (3), ultrasonic vibrations having the same frequency were applied to all of the samples. The displacement was increased with reducing the load. Therefore, the load should be small so as not to damage the semiconductor chip, but the displacement of the semiconductor chip must be increased.

SUMMARY OF THE INVENTION

The present invention was invented to solve the problems of the conventional technology.

An object of the present invention is to provide a structure of mounting an electronic component on a circuit board, which is capable of securely flip-chip-bonding the electronic component having bumps, whose separations are very short, to the circuit board without displacement. Another object is to provide a method of producing the mounting structure of the present invention.

To achieve the objects, the present invention has following structures. Namely, the structure of mounting an electronic component on a circuit board is characterized in that bumps of the electronic component are respectively flip-chip-bonded to electrodes of the circuit board by applying ultrasonic vibrations to the electronic component, and that a center of-each of the bumps is previously relatively displaced, with respect to a center in a width direction of each of the electrodes, in a direction parallel to a direction of the ultrasonic vibrations.

In the structure, the bumps may be arranged in the electronic component at regular separations, and the electrodes may be arranged in the circuit board at regular separations.

Note that, the electronic component is not limited to a semiconductor chip having bumps, other electronic component having bumps for electric bonding may be applied.

Another structure of mounting an electronic component on a circuit board is characterized in that bumps of the electronic component are respectively flip-chip-bonded to electrodes of the circuit board by applying ultrasonic vibrations to the electronic component, that the electronic component further includes positioning bumps, whose diameters are larger than those of the bumps and whose projecting lengths are longer than those of the bumps, and that the circuit board further includes pads, on which the positioning bumps of the electronic component are respectively bonded.

With this structure, the positioning bumps of the electronic component are bonded by the pads of the circuit board, so that displacement of the electronic component with respect to the circuit board can be prevented. Therefore, the bumps of the electronic component can be securely bonded to the electrodes of the circuit board when the electronic component is mounted on the circuit board by ultrasonic vibrations.

Further, the method of mounting an electronic component on a circuit board comprises the steps of: firstly flip-chip-bonding positioning bumps of the electronic component to pads of the circuit board by applying ultrasonic vibrations to the electronic component; and secondly flip-chip-bonding bumps, whose diameters are shorter than those of the positioning bumps and whose projecting lengths are shorter than those of the positioning bumps, of the electronic component to electrodes of the circuit board by applying ultrasonic vibrations to the electronic component.

With this method, the positioning bumps of the electronic component are firstly bonded to the pads of the circuit board, so that the electronic component can be correctly mounted on the circuit board without displacement.

Another method of mounting an electronic component on a circuit board comprises the steps of: flip-chip-bonding positioning bumps of the electronic component to pads of the circuit board by applying ultrasonic vibrations to the electronic component; and flip-chip-bonding bumps, whose diameters are shorter than those of the positioning bumps and whose projecting lengths are shorter than those of the positioning bumps, of the electronic component to electrodes of the circuit board by applying ultrasonic vibrations to the electronic component, wherein the positioning bumps are firstly tentatively flip-chip-bonded to the pads by applying ultrasonic vibrations to the electronic component, displacement of the electronic component, which has been tentatively bonded to the circuit board, with respect to the regular position in the circuit board is measured, and the electronic component is completely bonded to the circuit board, by applying ultrasonic vibrations to the electronic component, with correcting the position of the electronic component on the basis of the measured displacement.

With this method, the electronic component is tentatively bonded to the circuit board, then the displacement of the electronic component is measured. Finally, the displacement is corrected on the basis of the measured displacement. Therefore, the electronic component can be precisely completely mounted on the circuit board.

To securely correct the displacement of the electronic component, a position and/or inclination of a table supporting the circuit board may be controlled when the electronic component is completely bonded to the circuit board, a -load applying to the electronic component may be controlled when the electronic component is completely bonded to the circuit board, and a direction of the ultrasonic vibrations may be asymmetrically controlled when the electronic component is completely bonded to the circuit board.

In the structures and the methods of the present invention, the electronic component can be securely flip-chip-bonded to the circuit board without displacement when the electronic component is mounted on the circuit board by applying ultrasonic vibrations. Therefore, even an electronic component, whose bump separations are very short, can be correctly mounted on the circuit board.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
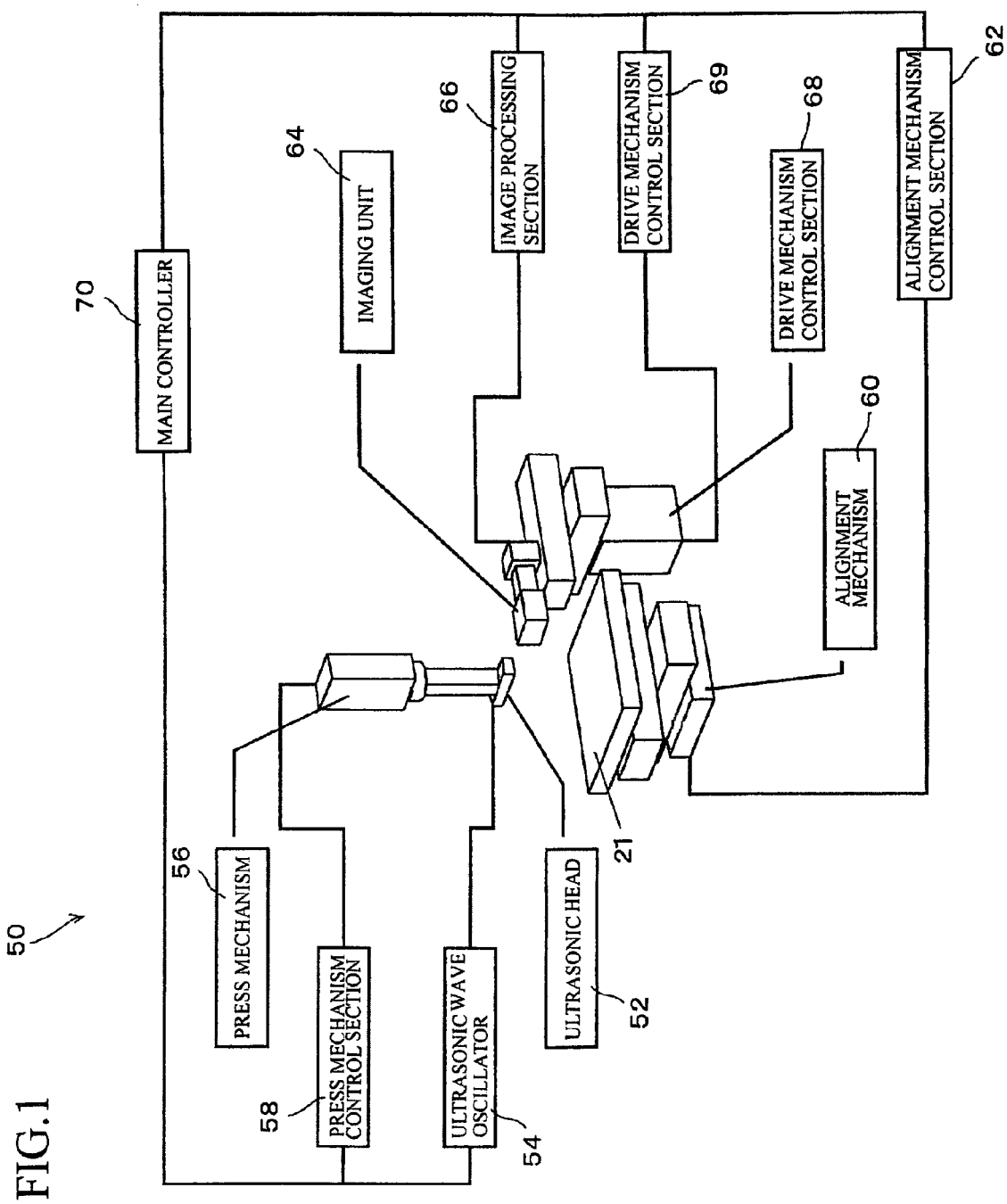
FIG. 1 is an explanation view of a mounting machine for flip-chip-bonding a semiconductor chip by the method of the present invention.

FIG. 1 shows a mounting machine 50 for flip-chip-bonding a semiconductor chip 10, which is an example of the electronic component, onto a circuit board 20.

The mounting machine 50 mainly comprises a ultrasonic head side and a supporting table side. The ultrasonic head side includes: a ultrasonic head 52 air-sucking and holding the semiconductor chip 10; a ultrasonic wave oscillator 54 applying ultrasonic vibrations to the ultrasonic head 52; a press mechanism 56 pressing the semiconductor chip 10 toward the circuit board 10; and a press mechanism control section 58 controlling a load of the press mechanism 56.

On the other hand, the supporting table side includes: an alignment mechanism 60 positioning and moving a supporting table 21 in X- Y- and θ-directions; and an alignment mechanism control section 62 controlling the alignment mechanism 60 so as to adjust mutual positions of the semiconductor chip 10 and the circuit board 20 and correctly flip-chip-bond the semiconductor chip 10 to the circuit board 20. Further, the supporting table side includes: an imaging unit 64, which acts as a detecting mechanism, detecting the mutual positions of the semiconductor chip 10 and the circuit board 20; an image processing section 66 processing image data sent from the imaging unit 64; a drive mechanism 68 moving the imaging unit 64; and a drive mechanism control section 69 controlling the drive mechanism 68 so as to move the imaging unit 64 to a prescribed position.

A main controller 70 controls the alignment mechanism control section 62, on the basis of results detected by the image processing section 66, so as to correctly position the semiconductor chip 10 and the circuit board 20. Then, the main controller 70 controls the press mechanism control section 58 and the ultrasonic wave oscillator 54, so that the semiconductor chip 10 can be flip-chip-bonded or mounted on the circuit board 20 with a suitable load.

Figure 2:
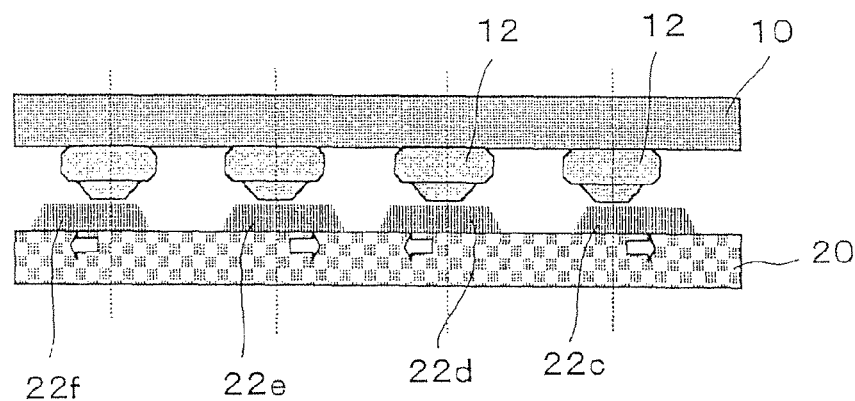
FIG. 2 is an explanation view showing an arrangement of bumps of the semiconductor chip and electrodes of a circuit board.
Figure 3:
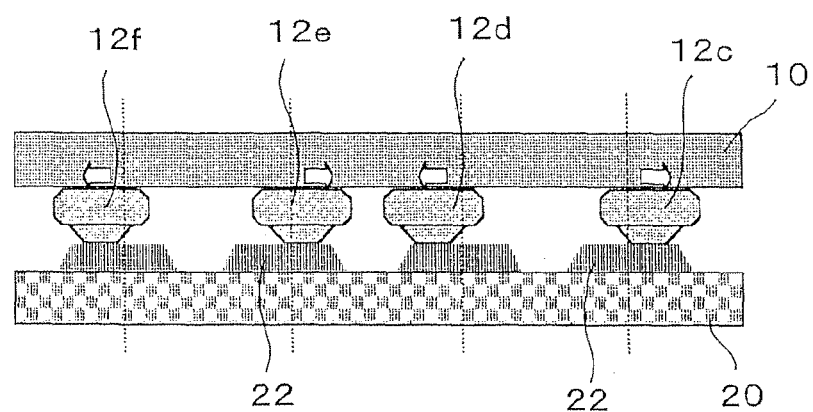
FIG. 3 is an explanation view showing an arrangement of the bumps of the semiconductor chip and the electrodes of the circuit board.

FIGS. 2 and 3 show embodiments of the structure of mounting the semiconductor chip 10 on the circuit board 20. An arrangement of bumps 12 of the semiconductor chip 10 and electrodes 22 of the circuit board 20 is shown in each of the drawings.

Conventionally, when the semiconductor chip 10 is flip-chip-bonded to the circuit board 20, the bumps 12 of the semiconductor chip 10 and the electrodes 22 of the circuit board 20 are mutually corresponded. On the other hand, in the present embodiment, a center of each bump 12 is slightly relatively displaced, with respect to a center in a width direction of each electrode 22. With this arrangement, the bumps 12 are properly bonded to the electrodes 22 when the semiconductor chip 10 is bonded to the circuit board 20 by applying ultrasonic vibrations.

In FIG. 2, the bumps 12 are provided to the semiconductor chip 10 at regular separations. On the other hand, the electrodes 22c, 22d, 22e and 22f are alternately displaced rightward and leftward with respect to the centers of the corresponded bumps 12. By previously displacing the electrodes 22 in the width direction with respect to the centers of the bumps 12, serious displacement of the bumps 12 and the electrodes 22 can be prevented on the whole even if the vibrated bumps 12 displace from the electrodes 22 when the semiconductor chip 10 is bonded to the circuit board 20 by applying ultrasonic vibrations.

Namely, if the centers of the bumps 12 and the centers in the width direction of the electrodes 22 are previously corresponded, all of the bumps 12 are moved in one direction with respect to the electrodes 22 by applying ultrasonic vibrations to the semiconductor chip 10. If the bumps 12 is moved in one direction, all of the bumps 12 disbond from the electrodes 22. In the present embodiment, the bumps 12 and the electrodes 22 are previously displaced, so all of the bumps 12 do not disbond from the electrodes 22 even if all of the bumps 12 are moved in one direction. Some of the electrodes 22 hold the bumps 12, so that the bumps 12 never disbond from the electrodes 22 on the whole. Therefore, bondability of the bumps 12 and the electrodes 22 can be improved.

A distance of displacing each electrode 22 with respect to each bump 12 is within an allowable variation range of mounting accuracy of mounting semiconductor chips on circuit boards. If the displacing distance is within the allowable range, the bumps 12 can be suitably bonded to the electrodes 22.

For example, if a diameter of each bump 12 is 20 μm and a separation between the centers of the adjacent bumps 12 is 40 μm, the maximum displacement (displacing distance) between the center of the bump 12 and the center of the electrode 22 is about 10 μm. Note that, a range of ultrasonic vibrations is about 1 μm.

In the above described embodiment, the bumps 12 are provided to the semiconductor chip 10 at regular separations, and the bumps 22 of the circuit board 20 are displaced. On the other hand, in an embodiment shown in FIG. 3, the bumps 12c, 12d, 12e and 12f are alternately displaced rightward and leftward with respect to the centers in the width direction of the corresponded electrodes 22.

In the present invention, the center of each bump 12 may be relatively displaced with respect to the center in the width direction of each electrode 22. The bumps 12 or the electrodes 22 may be arranged at regular separations. Further, if the centers of the bumps 12 and the electrodes 22 are relatively displaced, the bumps 12 and the electrodes 22 need not be arranged at regular separations. In this case too, the same effects can be gained.

In the above described embodiments, a direction parallel to the direction of ultrasonic vibrations is regarded as a standard direction. Each of the bumps 12 is relatively displaced with respect to each of the electrodes 22 in the standard direction. The bumps 12 may be alternately or randomly displaced toward one side and the other side of each of the electrodes 22.

Figure 7A:
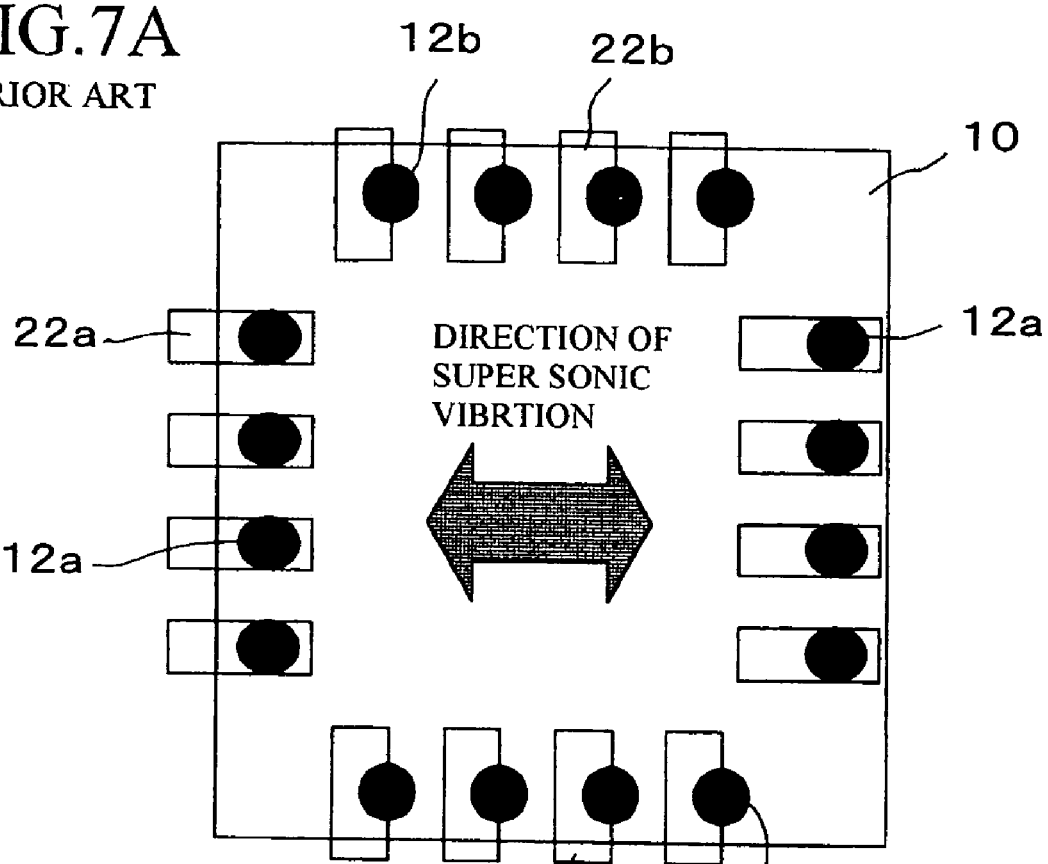
FIG. 7A is a plan view showing the displacement of the bumps and the electrodes in the conventional mounting structure.
Figure 7B:
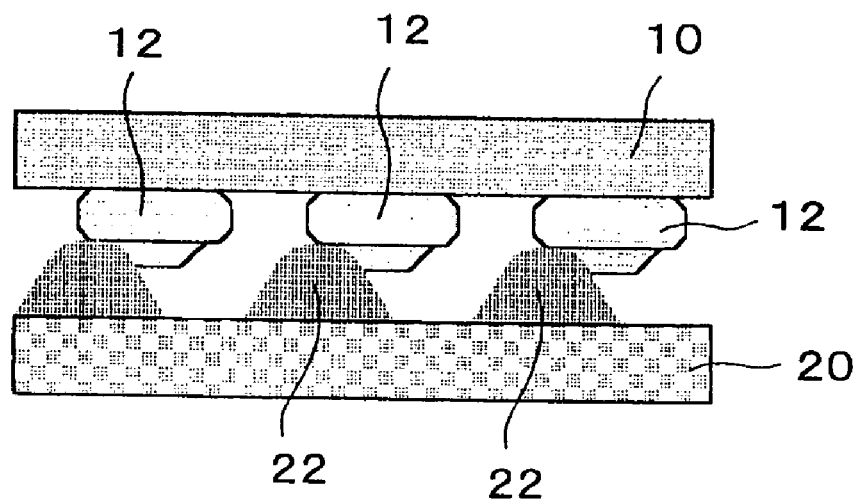
FIG. 7B is a partial front view of bonding sections between the semiconductor chip and the circuit board in the conventional mounting structure.
Figure 8:
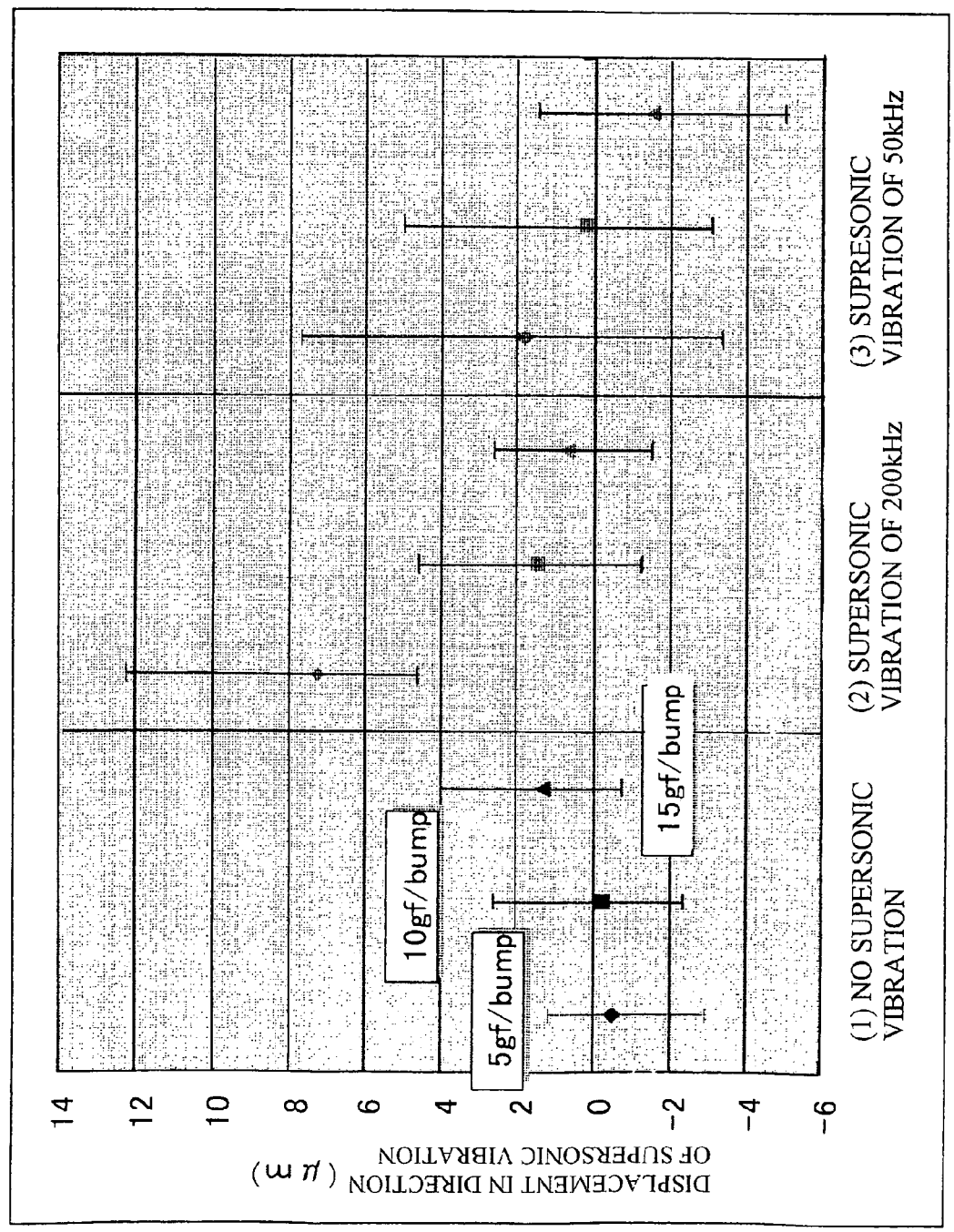
FIG. 8 is a graph showing displacement of the semiconductor chips with respect to the circuit boards.

Generally, the bumps 12 are arranged along edges of the rectangular semiconductor chip 10 (see FIG. 7A). The bumps 12 and/or the electrodes 22 arranged in the standard direction are displaced. Note that, if the electrodes 22 are not formed into the thin rectangles, it is effective to displace the electrodes 22 arranged perpendicular to the standard direction, with respect to the centers of the bumps 12 as well as the electrodes 22 arranged parallel to the standard direction.

Figure 4:
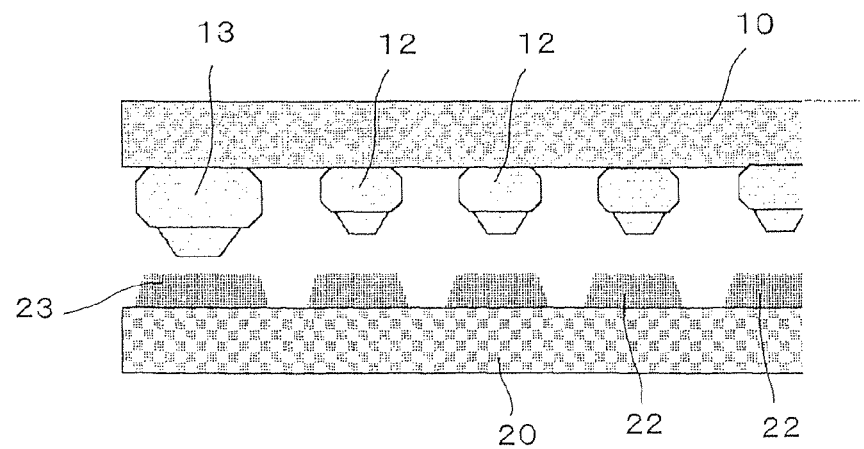
FIG. 4 is an explanation view showing an arrangement of the bumps of the semiconductor chip and the electrodes of the circuit board.

Further, another embodiment is shown in FIG. 4. In the present embodiment, the semiconductor chip 10 has not only the bumps 12 for electric bonding but also bumps 13 for positioning the semiconductor chip 10.

As shown in FIG. 4, each positioning bump 13 has a diameter larger than that of each bump 12 and a projection length longer than that of each bump 12. On the other hand, the circuit board 20 has positioning pads 23, to which the positioning bumps 13 are respectively bonded. To bond the positioning bumps 13, the pads 23 are broader than the electrodes 22.

When the semiconductor chip 10 is mounted onto the circuit board 20, the positioning bumps 13 firstly contact the pads 23, then the bumps 12 contact the electrodes 22. Since the positioning bumps 13 contact the pads 23 of the circuit board 20, the semiconductor chip 10 is exceedingly displaced, with respect to the circuit board 20, by ultrasonic vibrations, so that the semiconductor chip 10 can be correctly mounted on the circuit board 20 without relatively displacing the bumps 12 from the electrodes 22.

In FIG. 4, the positioning bumps 13 are provided to ends of each line of the bumps 12, but the positions of the positioning bumps 13 are not limited to an example shown in FIG. 4. The positioning bumps 13 may be provided to, for example, intermediate positions of each line of the bumps 12.

Figure 5:
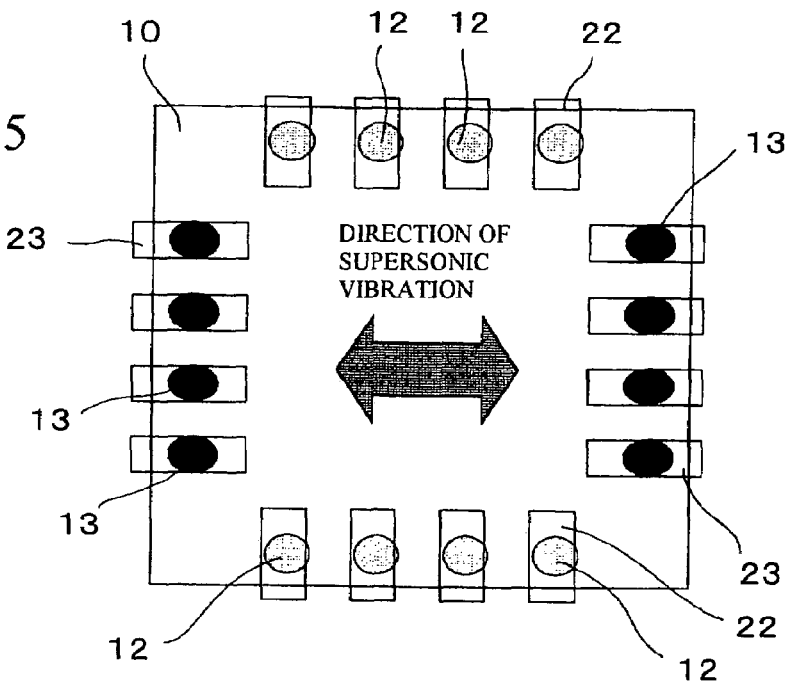
FIG. 5 is an explanation view showing a planar arrangement of the bumps of the semiconductor chip and the electrodes of the circuit board.

A method of mounting the semiconductor chip 10 having the positioning bumps 13 on the circuit board 20 will be explained with reference to FIG. 5. In FIG. 5, the positioning bumps 13 are arranged in a direction perpendicular to the direction of ultrasonic vibrations (standard direction). The longitudinal direction of the rectangular positioning bumps 13 are parallel to the standard direction. On the other hand, the bumps 12 for electric bonding are arranged parallel to the standard direction. By arranging the positioning bumps 13 perpendicular to the standard direction, the positioning bumps 13 firstly contact the pads 23, then the bumps 12 contact the electrodes 12 when the semiconductor chip 10 is mounted onto the circuit board 20. Therefore, the positioning bumps 13 act as stoppers to restrain displacing the bumps 12 from the electrodes 12, so that the bumps 12 can be securely bonded to the electrodes 12.

Note that, in FIG. 5, all of the bumps 13 arranged perpendicular to the standard direction are positioning bumps, but some of them may be used as the bumps 12 for electric bonding. Further, some of the bumps 12 arranged parallel to the standard direction may be used as the positioning bumps 13.

When the semiconductor chip 10 having the positioning bumps 13 is mounted onto the circuit board 20, the positioning bumps 13 firstly contact the pads 23. Thus, the semiconductor chip 10 may be tentatively bonded to the circuit board 20 by the positioning bumps 13. In this case, displacement of the semiconductor chip 10 with respect to the circuit board 20 is measured, then the alignment mechanism 60 supporting the circuit board 20 is controlled on the basis of the measured displacement so as to completely bond the semiconductor chip 10 to the circuit board 20.

Figure 6:
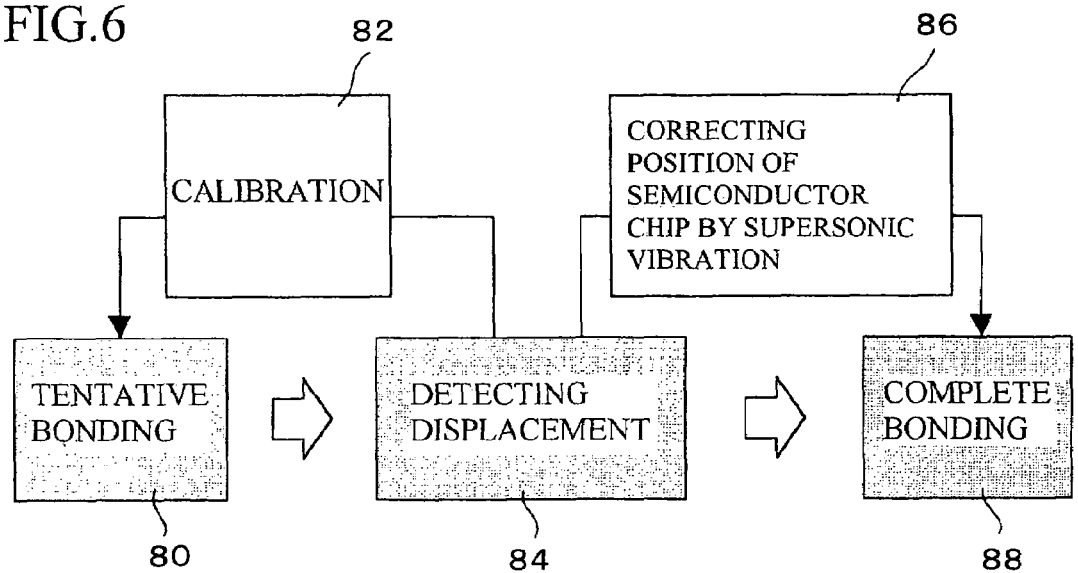
FIG. 6 is an explanation view showing a method including a tentatively bonding step and a completely bonding step.

The method including the tentatively bonding step and the completely bonding step will be explained with reference to FIG. 6. As described above, firstly the semiconductor 10 is tentatively bonded to the circuit board 20 by the positioning bumps 13 (Step 80). Then, a calibration step is performed. Namely, the drive mechanism control section 69 controls the drive mechanism 68 so as to move the imaging unit 64 to a position above the supporting table and scan image data of the semiconductor chip 10, which has been tentatively bonded to the circuit board 20 (Step 82). If an infrared image scanner or camera is used as the imaging unit 64, the bonded position of the semiconductor chip 10 can be detected as if it is seen fluoroscopically.

In Step 84, the image processing section 66 measured the displacement of the semiconductor chip 10 with respect to the regular position on the circuit board 20 on the basis of the image data sent from the imaging unit 64.

Next, the main controller 70 calculates correction data, which will be used for correcting actions of the alignment mechanism 60, the ultrasonic wave oscillator 54 and the press mechanism 56, on the basis of the displacement measured in Step 84 (Step 86). Then, the semiconductor chip 10 is completely bonded to the circuit board 20 (Step 88).

The correction data calculated in Step 86, e.g., the displaced distance and the displaced direction of the semiconductor chip 10 with respect to the regular position, are fed back to correctly position the semiconductor chip 10. With this feedback control, the semiconductor chip 10 can be bonded at regular position on the circuit board 20 in the completely bonding step (Step 88).

There are several means to correct the displacement of the semiconductor chip 10. For example, the supporting table, which constitutes the alignment mechanism 60 and supports the circuit board 20, may be slightly moved in X- Y- and θ-directions to correct the displacement and bond at the regular position; inclination of the supporting table may be controlled to correct the displacement in the completely bonding step; a load applied to the semiconductor chip 10 may be controlled; and ultrasonic vibration may be asymmetrically applied to the semiconductor chip 10 to correct the displacement. Further, a plurality of above means may be combined. Note that, the word "asymmetrically" means that a speed of ultrasonic vibrations in one direction is greater than that in the other direction. Namely, a range of ultrasonic vibrations in one direction is much greater than that in the other direction.

In this method, the semiconductor chip 10 is mounted on the circuit board 20 by the two bonding steps: the tentative bonding step and the completely bonding step, the displacement of the semiconductor chip 10 with respect to the regular position on the circuit board 20 is measured in the tentative bonding step, and the displacement is corrected by the feedback control in the completely bonding step. Therefore, the semiconductor chip 10 can be flip-chip-bonded to the circuit board 20 with high accuracy. Since the high precision mounting can be realized, yield of the flip chip bonding can be improved and very small electronic components, which have been difficult to mount by flip chip bonding, can be securely mounted.

As described in background of the invention, the displacement of the semiconductor chip is increased with increasing frequency of ultrasonic vibrations. However, in the present invention, the semiconductor chip 10 can be securely mounted on the circuit board 20 with high mounting accuracy even if the frequency of ultrasonic vibrations is increased. By increasing the frequency of ultrasonic vibrations, required time for flip chip bonding can be shortened, so the secure flip chip mounting can be efficiently performed.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of mounting an electronic component on a circuit board, comprising the steps of:
   firstly flip-chip-bonding positioning bumps of said electronic component to pads of said circuit board by applying ultrasonic vibrations to said electronic component; and
   secondly flip-chip-bonding bumps, whose diameters are shorter than those of the positioning bumps and whose projecting lengths are shorter than those of the positioning bumps, of said electronic component to electrodes of said circuit board by applying ultrasonic vibrations to said electronic component.
   wherein an array direction of the positioning bumps is perpendicular to a direction of the ultrasonic vibrations.

2. A method of mounting an electronic component on a circuit board, comprising the steps of:
   flip-chip-bonding positioning bumps of said electronic component to pads of said circuit board by applying ultrasonic vibrations to said electronic component; and
   flip-chip-bonding bumps, whose diameters are shorter than those of the positioning bumps and whose projecting lengths are shorter than those of the positioning bumps, of said electronic component to electrodes of said circuit board by applying ultrasonic vibrations to said electronic component,
   wherein the positioning bumps are firstly tentatively flip-chip-bonded to the pads by applying ultrasonic vibrations to said electronic component, displacement of said electronic component, which has been tentatively bonded to said circuit board, with respect to the regular position in said circuit board is measured, and said electronic component is completely bonded to said circuit board, by applying ultrasonic vibrations to said electronic component, with correcting the position of said electronic component on the basis of the measured displacement.
   wherein an array direction of the positioning bumps is perpendicular to a direction of the ultrasonic vibration.

3. The method according to claim 2, wherein a position and/or inclination of a table supporting said circuit board is controlled when said electronic component is completely bonded to said circuit board.

4. The method according to claim 2, wherein a load applying to said electronic component is controlled when said electronic component is completely bonded to said circuit board.

5. The method according to claim 2, wherein a direction of the ultrasonic vibrations is asymmetrically controlled when said electronic component is completely bonded to said circuit board.

* * * * *